US011774852B2

(12) United States Patent
Bae et al.

(10) Patent No.: US 11,774,852 B2
(45) Date of Patent: *Oct. 3, 2023

(54) PHOTOSENSITIVE RESIN COMPOSITION AND DISPLAY DEVICE

(71) Applicant: Duk San Neolux Co., Ltd, Cheonan-si (KR)

(72) Inventors: Jun Bae, Cheonan (KR); Chang Min Lee, Cheonan (KR); Jun Ki Kim, Cheonan (KR); Jae Hyun Lim, Cheonan (KR); Soung Yun Mun, Cheonan (KR)

(73) Assignee: Duk San Neolux Co., Ltd.

( * ) Notice: Subject to any disclaimer, the term of this patent is extended or adjusted under 35 U.S.C. 154(b) by 253 days.

This patent is subject to a terminal disclaimer.

(21) Appl. No.: 17/102,606

(22) Filed: Nov. 24, 2020

(65) Prior Publication Data

US 2021/0165320 A1 Jun. 3, 2021

(30) Foreign Application Priority Data

Nov. 28, 2019 (KR) ..................... 10-2019-0156099

(51) Int. Cl.
*C08G 63/676* (2006.01)
*C08G 63/695* (2006.01)
(Continued)

(52) U.S. Cl.
CPC ........... *G03F 7/032* (2013.01); *C08G 63/676* (2013.01); *C08G 63/6958* (2013.01);
(Continued)

(58) Field of Classification Search
CPC .............................. G03F 7/0758; G03F 7/0757
See application file for complete search history.

(56) References Cited

U.S. PATENT DOCUMENTS 7,784,014 B1 * 8/2010 Brebner .................. G06F 30/30
716/117
9,691,990 B2 6/2017 Mun et al.
(Continued)

FOREIGN PATENT DOCUMENTS

JP 2005208572 A 8/2005
KR 20090056014 A * 6/2009 ............. G02B 5/223
(Continued)

OTHER PUBLICATIONS

Lowe et al., Thiol-ene "click" reactions and recent applications in polymer and materials synthesis: a first update (A.B. Lowe, Polym. Chem., 5, 4820-4870 (2014)) (Year: 2014).*
(Continued)

*Primary Examiner* — Mark F. Huff
*Assistant Examiner* — Andrew Preston Traywick
(74) *Attorney, Agent, or Firm* — Harness, Dickey & Pierce, P.L.C.

(57) ABSTRACT

A photosensitive resin composition capable of reducing residues upon the development thereof, reducing melting flow, and forming a pattern layer having a high taper angle, by containing two or more kinds of different cardo binders; and a display device including a pattern layer containing a polymerization reaction product of the photosensitive resin composition.

12 Claims, 3 Drawing Sheets

(51) Int. Cl.
  *G03F 7/00* (2006.01)
  *G03F 7/032* (2006.01)
  *G03F 7/075* (2006.01)
  *G03F 7/037* (2006.01)
  *H10K 59/122* (2023.01)

(52) U.S. Cl.
  CPC ............ *G03F 7/0007* (2013.01); *G03F 7/037* (2013.01); *G03F 7/0758* (2013.01); *H10K 59/122* (2023.02)

(56) References Cited

U.S. PATENT DOCUMENTS

| | | | | |
|---|---|---|---|---|
| 10,446,762 | B2 | 10/2019 | Kim et al. | |
| 10,672,992 | B2 | 6/2020 | Kim et al. | |
| 10,763,443 | B2 | 9/2020 | Kim et al. | |
| 11,130,838 | B2* | 9/2021 | Lee | G03F 7/038 |
| 2008/0090177 | A1* | 4/2008 | Oh | G03F 7/032 |
| | | | | 430/286.1 |
| 2012/0145971 | A1* | 6/2012 | Lee | G03F 7/027 |
| | | | | 252/582 |
| 2015/0050595 | A1 | 2/2015 | Kim et al. | |
| 2015/0111156 | A1* | 4/2015 | Lee | G03F 7/0007 |
| | | | | 430/285.1 |
| 2016/0139507 | A1* | 5/2016 | Kim | G03F 7/0388 |
| | | | | 252/586 |
| 2019/0278173 | A1* | 9/2019 | Kim | G02B 5/22 |
| 2020/0241415 | A1 | 7/2020 | Lee et al. | |

FOREIGN PATENT DOCUMENTS

| | | | | |
|---|---|---|---|---|
| KR | 2012-0045076 A | | 5/2012 | |
| KR | 201701111133 A1 * | | 10/2017 | ............ G03F 7/105 |
| WO | WO-2015005546 A1 * | | 1/2015 | ............ G02B 5/223 |
| WO | 2019/078566 A1 | | 4/2019 | |
| WO | WO-2019194402 A1 * | | 10/2019 | ........... C08G 63/187 |

OTHER PUBLICATIONS

Translated Description of Choi (Year: 2009).*
Translated Description of Kiyoshi (Year: 2015).*
Translation of Kim (Year: 2017).*

* cited by examiner

|  | Comparative Example 1 Polymer A-1 (used alone) | Comparative Example 2 Polymer A-2 (used alone) | Comparative Example 3 Polymer B-1 (used alone) | Comparative Example 4 Polymer C (used alone) | Comparative Example 5 Polymer D (used alone) |
|---|---|---|---|---|---|
| Pattern image | | | | | |

Fig. 1

|  | Example 1 A-1 + A-2 (used in mix) | Example 2 A-1 + A-2 + B-1 (used in mix) | Example 3 A-1 + A-2 + D (used in mix) |
|---|---|---|---|
| Pattern image | 17.5 µm | 17.2 µm | 15.3 µm |

Fig. 2

| | Pattern image | SEM image (after developing) | SEM image (after curing) | Taper angle |
|---|---|---|---|---|
| Example 1 | 17.5 μm | | | 33° |
| Example 2 | 17.2 μm | | | 40° |
| Example 3 | 15.3 μm | | | 22° |

| Example 1 Fine pattern image Resolution: 5-6 μm | Example 2 Fine pattern image Resolution: 1 μm | Comparative Example 1 Fine pattern image Resolution: 8 μm | Comparative Example 2 Fine pattern image Resolution: 8 μm |
|---|---|---|---|
|  |  |  |  |

Fig. 5

|  | Microscope image | SEM image (after developing) | SEM image (after curing) |
|---|---|---|---|
| Example 4 | 17.5 μm |  |  |
| Example 5 | 16.9 μm |  |  |
| Example 6 | 14.7 μm |  |  |

Fig. 6

PHOTOSENSITIVE RESIN COMPOSITION AND DISPLAY DEVICE

CROSS-REFERENCE TO RELATED APPLICATIONS

This application claims the benefit and priority of Korean Patent Application No. 10-2019-0156099 filed on Nov. 28, 2019. The entire disclosure of the above application is incorporated herein by reference.

BACKGROUND OF THE INVENTION

1. Field of the Invention

Embodiments of the present disclosure relate to a photosensitive resin composition and a display device.

2. Description of the Prior Art

Colored light-shielding layers, especially, a black-colored light-shielding layer is used to improve image quality by preventing color interference between red, green, and blue color filters in a liquid crystal display device. Recently, the colored light-shielding layers have been researched for an organic light emitting display device in order to achieve the same purposes as in a liquid crystal display device, such as preventing color mixing between adjacent pixels and achieving low reflectivity for improving image visibility.

SUMMARY OF THE INVENTION

Colorants and several types of resins are used in the manufacturing of colored light-shielding layers, but resolution, heat resistance, and adhesion, upon the development therefor, need to be improved.

Moreover, for black-colored light-shielding layers, a high content of a black pigment is added, but sensitivity and adhesion may be severely degraded due to the black pigment.

Therefore, embodiments of the present disclosure can provide a photosensitive resin composition capable of reducing residues around patterns and in developed parts upon the development thereof, reducing melting flow, and implementing a high taper angle when used as a pixel defining layer, by containing two or more kinds of cardo binders.

Furthermore, embodiments of the present disclosure can provide a display device including a pixel defining layer having high resolution and a high taper angle by including a pattern layer containing a polymerization reaction product of the above-described photosensitive resin composition.

In an aspect, embodiments of the present disclosure may provide a photosensitive resin composition including: (A) two or more kinds of cardo binders containing a repeating unit represented by Formula 1 below and having different molecular weights; (B) a reactive unsaturated compound; (C) a pigment; (D) an initiator; and (E) a solvent:

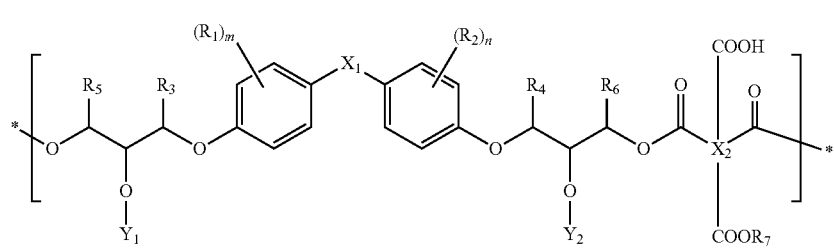

[Formula 1]

According to embodiments, a photosensitive resin composition can be provided capable of reducing residues upon the development thereof, reducing melting flow, and forming a pattern layer having a high taper angle, by containing two or more kinds of different cardo binders.

Furthermore, according to embodiments, a display device, which has high resolution by including a pattern layer containing a polymerization reaction product of the above-described photosensitive resin composition, can be provided.

BRIEF DESCRIPTION OF THE DRAWINGS

Hereinafter, some embodiments of the present disclosure will be described in detail with reference to the accompanying drawings in which:

FIG. 1 shows pattern images using certain polymers;

FIG. 2 shows pattern images using certain other polymers;

FIG. 5 shows pattern images of examples and comparative examples; and

FIG. 6 shows images of certain examples.

DESCRIPTION OF THE PREFERRED EMBODIMENTS

Figures 3, 4:
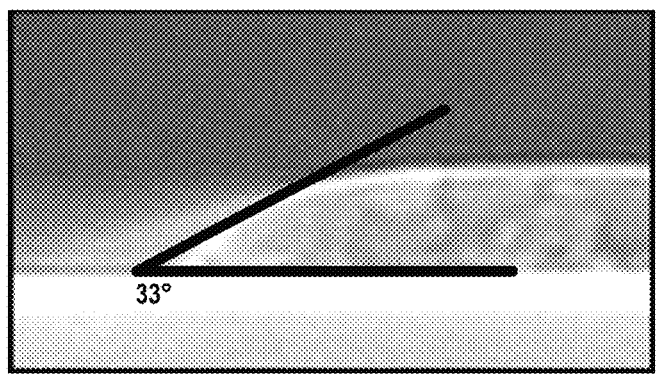
FIG. 3 shows results of comparing taper angles in Examples 1 to 3.
FIG. 4 shows how taper angles were determined.

In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear. In a case where "comprise", "have", and "include" described herein are used, another element may be added unless "only" is used. The terms of a singular form may include plural forms unless referred to the contrary.

Further, in the description of components of the present disclosure, terms, such as first, second, A, B, (a), and (b), may be used. These terms are just to distinguish the components from any other components but do not limit the nature or sequence or order and the like of corresponding features by the terms.

It should also be understood that in the description of positional relationships of components, if two or more components were described as being "connected", "bonded", or "linked" to each other, the two or more components may not only be directly "connected", "bonded", or "linked" to each other, but may also be "connected", "bonded", or "linked" to each other by further intervening of a third component. Herein, the third component may be included in one or more of the two or more components that are "connected", "coupled", or "linked" to each other.

In the description of the temporal flow relationship with respect to components, operation methods, or production methods, for example, when a temporal order relationship or a flow order relationship is described by "after", "following", "then", "before", and the like, the relationship may include non-consecutive cases unless the term "immediately" or "directly" is used.

When a numerical value for a component or corresponding information is mentioned, the numerical value or corresponding information may be interpreted as encompassing an error range that may occur due to various factors (e.g., process factors, internal or external impacts, noise, etc.) even though there is no explicit description.

The term "halo" or "halogen" as used herein, unless otherwise indicated, includes fluorine (F), chlorine (Cl), bromine (Br), iodine (I), and the like.

The term "alkyl" or "alkyl group" used herein, unless otherwise indicated, may refer to a radical of a saturated aliphatic functional group having 1 to 60 carbon atoms linked by a single bond, including straight chain alkyl groups, branched chain alkyl groups, cycloalkyl (alicyclic) groups, alkyl-substituted cycloalkyl groups, and cycloalkyl-substituted alkyl groups.

The term "haloalkyl group" or "halogen alkyl group" as used herein, unless otherwise indicated, may refer to an alkyl group substituted with halogen.

The term "alkenyl" or "alkynyl" as used herein, unless otherwise indicated, may refer to a group that may have a double or triple bond, straight chain or branched chain group, and 2 to 60 carbon atoms.

The term "cycloalkyl" as used herein, unless otherwise indicated, may refer to alkyl having 3 to 60 carbon atoms that forms a ring.

The team "alkoxy group" or "alkyloxy group" as used herein may refer to an alkyl group having an oxygen radial attached thereto, and unless otherwise indicated, the group may have 1 to 60 carbon atoms.

The team "alkenoxyl group", "alkenoxy group" "alkenyloxyl group" or "alkenyloxy group" as used herein may refer to an alkenyl group having an oxygen radial attached thereto, and unless otherwise indicated, the group may have 2 to 60 carbon atoms.

The terms "aryl group" and "arylene group" as used herein, unless otherwise indicated, may refer to a group having 6 to 60 carbon atoms, but is not limited thereto. The aryl group or arylene group herein may include monocyclic forms, ring assemblies, fused polycyclic systems, compounds, and the like. For example, the aryl group may refer to a phenyl group, a monovalent functional group of biphenyl, a monovalent functional group of naphthalene, a fluorenyl group, or a substituted fluorenyl group.

The team "fluorenyl group" or "fluorenylene group" as used herein, unless otherwise indicated, may refer to a monovalent or divalent functional group of fluorene. The term "substituted fluorenyl group" or "substituted fluorenylene group" may refer to a monovalent or divalent functional group of substituted fluorene. The term "substituted fluorene" may refer to one in which at least one of the following substituents R, R', R", and R''' is a functional group excluding hydrogen. The term may encompass a case where R and R' are bonded to form a spiro compound together with carbon atoms attached thereto.

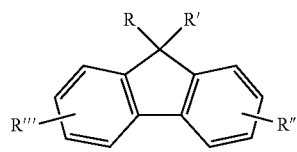

In addition, R, R', R", and R'" may be each independently an alkyl group having 1 to 20 carbon atoms, an alkenyl group having 1 to 20 carbon atoms, an aryl group having 6 to 30 carbon atoms, or a heterocyclic group having 3 to 30 carbon atoms. For example, the aryl group may be phenyl, biphenyl, naphthalene, anthracene, or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline. For example, the substituted fluorenyl group and the substituted fluorenylene group each may be a monovalent or divalent functional group of 9,9-dimethylfluorene, 9,9-diphenylfluorene, and 9,9'-spirobi[9H-fluorene].

The team "ring assembly" as used herein refers to a compound in which two or more rings (monocyclic ring or fused ring systems) are joined directly by single or double bonds and in which the number of such direct junctions between rings is one less than a total number of the ring systems in the compound. In such a ring assembly, the same or different ring systems may be joined directly by single or double bonds.

Herein, the aryl group includes a ring assembly, and thus the aryl group includes biphenyl and terphenyl in which benzene rings, which are single aromatic rings, are joined by a single bond. In addition, the aryl group also includes a compound in which a single aromatic ring is joined to a fused aromatic ring system by a single bond, and thus may include a compound in which a benzene ring, which is a single aromatic ring, is joined to fluorene, which is a fused aromatic ring, by a single bond.

The term "fused polycyclic system" as used herein refers to a form of fused rings sharing at least two atoms, and includes a form in which two or more hydrocarbon ring systems are fused, a form in which at least one fused hetero-ring system containing at least one heteroatom is fused, and the like. Such a fused polycyclic system may be an aromatic ring, a hetero-aromatic ring, an aliphatic ring, or a combination thereof.

The team "spiro compound" as used herein has "a spiro union", and the spiro union refers to a union made by two rings sharing only one atom. The atom shared by the two rings is referred to as a "spiro atom", and such compounds may be referred to as "monospiro-", "dispiro-", and "trispiro-" compounds depending on the number of spiro atoms included in one compound.

The term "heterocyclic group" as used herein includes not only aromatic rings, such as "heteroaryl groups" or "heteroarylene groups", but also non-aromatic rings, and unless otherwise indicated, the heterocyclic group refers to a ring of 2 to 6 carbon atoms containing one or more heteroatoms, but is not limited thereto. The team "heteroatom" as used herein, unless otherwise indicated, may represent N, O, S, P, and Si, and the heterocyclic group may refer to a monocyclic form, a ring assembly, a fused polycyclic system, a spiro compound, or the like, which contains a heteroatom.

The "heterocyclic group" may also include a ring containing $SO_2$ instead of carbon that forms a ring. For examples, the "heterocyclic group" may include the following compound.

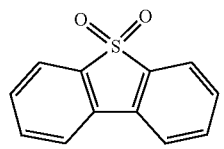 [SMILES: O=S1(=O)c2ccccc2-c2ccccc21]

The team "ring" as used herein, unless otherwise indicated, may include monocyclic rings and polycyclic rings, include not only hydrocarbon rings but also heterocyclic rings containing at least one heteroatom, and include aromatic rings as well as non-aromatic rings.

The team "polycyclic" as used herein may include ring assemblies, such as biphenyl and terphenyl, fused polycyclic systems, and spiro compounds, include aromatic rings as well as non-aromatic rings, and include hydrocarbon rings as well as heterocyclic rings containing at least one heteroatom.

When prefixes are named subsequently, it may mean that substituents are listed in the order described first. For example, the arylalkoxy group may refer to an alkoxy group substituted with an aryl group, the alkoxylcarbonyl group may refer to a carbonyl group substituted with an alkoxyl group, and the arylcarbonylalkenyl group may refer to an alkenyl group substituted with an arylcarbonyl group. The arylcarbonyl group may be a carbonyl group substituted with an aryl group.

The term "substituted" in "substituted or unsubstituted" as used herein, unless otherwise indicated, may refer to being substituted with at least one substituent selected from the group consisting of deuterium, halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ arylalkenyl group, a silane group, a boron group, a germanium group, and a $C_2$-$C_{20}$ heterocyclic group containing at least one heteroatom selected from the group consisting of O, N, S, Si and P, without limitation to these substituents.

Herein, for the "functional group name" corresponding to an aryl group, an arylene group, a heterocyclic group, and the like, exemplified for each symbol and its substituent, may be expressed by "name of a functional group reflecting the valence" and may also be expressed by "name of a parent compound". For example, in the case of "phenanthrene", which is a kind of aryl group, the groups thereof may be named by distinguishing the valences thereof, such as "phenanthryl (group)" for a monovalent group and "phenanthrylene (group)" for a divalent group, but may also be named as "phenanthrene", which is a name of the parent compound, regardless of their valences. Similarly, in the case of pyrimidine, the groups thereof may be named as "pyrimidine" regardless of their valences, or may be also named as the names of "groups" of corresponding valences, such as pyrimidinyl (group) for a monovalent group and pyrimidinylene (group) for a divalent group. Therefore, when the kinds of substituent herein are named as a name of a parent compound, the name may mean an n-valent "group" that is formed by the release of a hydrogen atom bonded with a carbon atom and/or a heteroatom of the mother compound.

Unless otherwise specified, the definition of substituents according to the definition of exponents in the following formula may be applied to the formulas used herein.

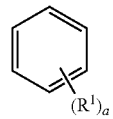

Wherein, when a is 0, the substituent $R^1$ is absent; when a is 1, the sole $R^1$ is linked to any one of the carbon atoms constituting the benzene ring; when a is 2 or 3, the substituent $R^1$'s are linked as follows and may be the same and different; and when a is 4 to 6, the substituent $R^1$'s are linked to the carbon atoms of the benzene ring in the similar manner. Meanwhile the expression of hydrogen linked to carbon constituents of the benzene ring may be omitted.

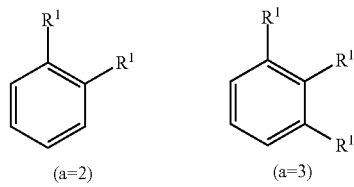

Herein, the meaning that substituents are linked to each other to form a ring is that a plurality of substituents linked to each other share a carbon atom or at least one atom of O, N, S, Si, and P, which are heteroatoms, to form a saturated or unsaturated ring. For example, as for naphthalene, an adjacent methyl group and butadienyl group, which are substituted on any one benzene ring, share one carbon atom to form an unsaturated ring, or a vinyl group and a propylene group share one carbon atom to form an unsaturated ring. In addition, fluorene itself may also be an aryl group having 13 carbon atoms, or may also be a compound wherein two methyl groups substituted on a biphenyl group are linked to each other so as to share one carbon atom, thereby forming a ring.

An organic electric element herein may mean constituent component(s) between an anode and a cathode, or may mean an organic light emitting diode including an anode, a cathode, and constituent component(s) disposed therebetween.

In some cases, an organic electric element herein may mean an organic light emitting diode and a panel including the same, or may also mean an electronic apparatus including a panel and a circuit. For example, the electronic device may include all of display devices, lighting devices, solar cells, portable or mobile terminals (e.g., smart phones, tablets, PDAs, electronic dictionaries, PMPs, etc.), navigation terminals, game consoles, various TVs, various computer monitors, and the like, and without limitation thereto, the electronic device may be any type of device as long as the electronic device includes the constitution(s).

A photosensitive resin composition according to embodiments includes (A) two or more kinds of cardo binders having different molecular weights; (B) a reactive unsaturated compound; (C) a pigment; (D) an initiator; and (E) a solvent The two or more kinds of cardo binders (A) include a repeating unit represented by Formula 1 below:

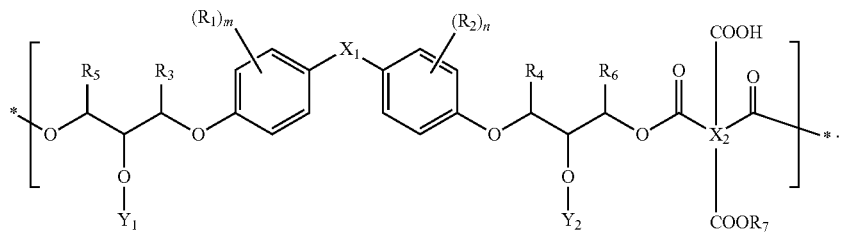

[Formula 1]

Hereinafter, Formula 1 above will be described.

"*" indicates a portion where a bond is connected to the repeating unit. Therefore, as for the repeating unit represented by Formula 1, the parts marked by square brackets may be linked to each other.

$R_1$ and $R_2$ are each independently selected from the group consisting of deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_6$-$C_{30}$ aryloxy group.

$R_1$ and $R_2$ may be each independently a $C_1$-$C_{40}$ alkyl group or a $C_1$-$C_{20}$ alkyl group.

$R_3$ to $R_6$ are each independently selected from the group consisting of hydrogen, deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_6$-$C_{30}$ aryloxy group.

$R_3$ to $R_6$ may be each independently a $C_1$-$C_{40}$ alkyl group or a $C_1$-$C_{20}$ alkyl group.

$R_7$ is selected from the group consisting of hydrogen, deuterium, a $C_1$-$C_{60}$ alkyl group, a $C_2$-$C_{60}$ alkenyl group, an acrylic group, and a methacrylic group.

$R_7$ may be a $C_1$-$C_{40}$ alkyl group or a $C_1$-$C_{20}$ alkyl group.

$R_7$ may be a $C_2$-$C_{40}$ alkenyl group or a $C_2$-$C_{20}$ alkenyl group.

m and n are each independently an integer of 0 to 4.

Adjacent $R^1$'s may be linked to each other to form a monocyclic or polycyclic ring when m is 2 or greater.

$R^2$'s may be linked to each other to form a monocyclic or polycyclic ring when n is 2 or greater.

$X_2$ is an acid anhydride residue or acid dianhydride residue.

$X_1$ is represented by Formula 2 below. Formula 2 will be described later.

$Y_1$ and $Y_2$ are each independently selected from the group consisting of hydrogen, deuterium, Formula 3 below; and Formula 4 below; Formulas 3 and 4 will be described later.

Hereinafter, Formula 2 above will be described.

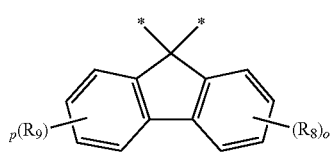

[Formula 2]

* indicates a portion where $X_1$ is linked to two benzene rings in Formula 1.

$R^8$ and $R^9$ are each independently selected from the group consisting of deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_2$-$C_{60}$ alkenyl group.

$R^8$ and $R^9$ may be each independently a $C_1$-$C_{40}$ alkyl group or a $C_1$-$C_{20}$ alkyl group.

$R^8$ and $R^9$ may be each independently a $C_1$-$C_{40}$ alkenyl group or a $C_1$-$C_{20}$ alkenyl group.

$R^8$ and $R^9$ may be each independently a $C_1$-$C_{40}$ alkoxy group or a $C_1$-$C_{20}$ alkoxy group.

o and p are each independently an integer of 0 to 4.

Adjacent $R_8$'s may be linked to each other to foil a monocyclic or polycyclic ring when o is 2 or greater.

$R_9$'s may be linked to each other to form a monocyclic or polycyclic ring when p is 2 or greater;

Hereinafter, Formulas 3 and 4 above will be described.

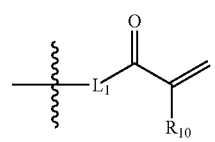

[Formula 3]

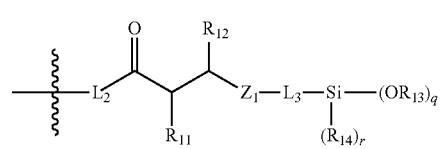

[Formula 4]

The bonding portion cut off by a wave mark indicates a portion where $Y_1$ and $Y_2$ are linked to oxygen in Formula 1.

$L_1$ to $L_3$ are each independently selected from the group consisting of a single bond, a $C_1$-$C_{60}$ alkylene group, and a $C_6$-$C_{60}$ arylene group.

$L_1$ to $L_3$ may be each independently a $C_1$-$C_{40}$ alkylene group or a $C_1$-$C_{20}$ alkylene group.

$L_1$ to $L_3$ may be each independently a $C_1$-$C_{40}$ arylene group or a $C_1$-$C_{20}$ arylene group.

$R_{10}$ to $R_{12}$ are each independently selected from the group consisting of hydrogen, deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, and a $C_1$-$C_{60}$ alkoxyl group.

$R_{10}$ to $R_{12}$ may be each independently a $C_1$-$C_{40}$ alkyl group or a $C_1$-$C_{20}$ alkyl group.

$R_{10}$ to $R_{12}$ may be each independently a $C_1$-$C_{40}$ alkoxy group or a $C_1$-$C_{20}$ alkoxy group.

$R_{13}$ is either a methyl group or an ethyl group.

$R_{14}$ is either a methoxy group or an ethoxy group.

$Z_1$ is S or O.

q and r are each independently an integer of 0 to 3, and q+r=3.

In at least one of the two or more kinds of cardo binders containing a repeating unit represented by Formula 1, at least one of $Y_1$ and $Y_2$ may be Formula 3 above.

In at least one of the two or more kinds of cardo binders containing a repeating unit represented by Formula 1, at least one of $Y_1$ and $Y_2$ may be Formula 4 above and may have a weight average molecular weight of 5000-7000.

A photosensitive resin composition according to embodiments can form a pattern layer without residues and exhibit excellent adhesion by containing the above-described two or more kinds of cardo binders represented by Formula 1.

imide, which is a main structure of a polymer, is copolymerized to control solubility, thereby obtaining an appropriate difference of solubility between an exposed region and a non-exposed region during a pattern formation, and thus implementing a black pixel barrier layer having excellent heat resistance and pattern formability.

For example, the polyamic acid-polyimide copolymer may include a polyamic acid repeating unit and a polyimide repeating unit, and the polyamic acid repeating unit and the polyimide repeating unit may be included at a molar ratio of 5:5 to 9:1, for example 2:2 to 8:2. The polyamic acid repeating unit and the polyimide repeating unit included at a molar ratio of the above range can ensure solubility in a solvent used in the composition and show appropriate developability in the patterning process. A usable polyimide-polyamic acid copolymer has a structure of Formula 5 below:

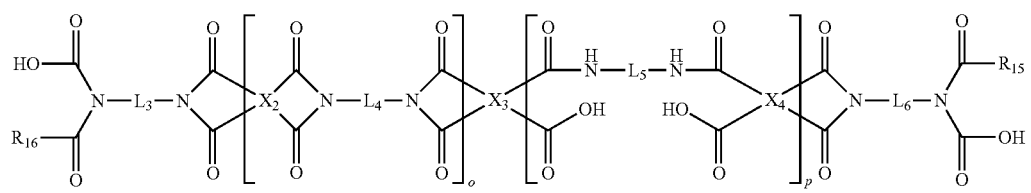 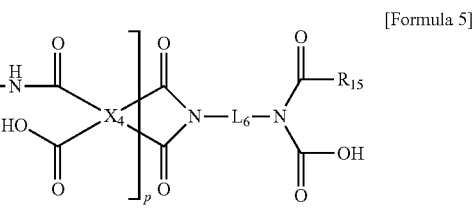

[Formula 5]

Hereinafter, Formula 5 above will be described.

$X_2$ to $X_4$ are each independently selected from the group consisting of a substituted or unsubstituted tetravalent alicyclic organic group and a substituted or unsubstituted tetravalent aromatic organic group.

$L_3$ to $L_6$ are each independently a single bond, a substituted or unsubstituted $C_1$-$C_{10}$ alkylene group, a substituted or unsubstituted $C_3$-$C_{10}$ cycloalkylene group, and a substituted or unsubstituted $C_6$-$C_{20}$ arylene group.

$R_{15}$ and $R_{16}$ are each independently selected from the group consisting of hydrogen and a substituted or unsubstituted norbornene group.

o and p are each independently an integer of 1 to 10,000.

The photosensitive resin composition according to embodiments contains (B) a reactive unsaturated compound.

For the reactive unsaturated compound, at least one kind of mono-functional or multi-functional ester of (meth) acrylic acid having at least one ethylenically unsaturated double bond may be used. The reactive unsaturated compound may be a monomer or an oligomer. Herein, the term "(meth)acrylic acid" may refer to methacrylic acid, acrylic acid, or a mixture of methacrylic acid and acrylic acid.

The reactive unsaturated compound may be a photo-polymerizable compound. Since the reactive unsaturated compound is a photo-polymerizable compound, the photosensitive resin composition undergoes sufficient polymerization upon the exposure in the pattern forming process, thereby forming a pattern having excellent heat resistance, light resistance, and chemical resistance.

The two or more kinds of cardo binders may include a low-molecular weight cardo binder and a high-molecular weight cardo binder.

The low-molecular weight cardo binder may have a weight average molecular weight of 3,000-5,000 or 3,000-4,800 while containing the above-described repeating unit represented by Formula 1.

The high-molecular weight cardo binder may have a weight average molecular weight of 7,000-9,000, 7,000-8,800, or 7,000-8,000 while containing the above-described repeating unit represented by Formula 1.

In the photosensitive resin composition containing a low-molecular weight cardo binder and a high-molecular weight cardo binder according to embodiments, the low-molecular weight cardo binder may be contained at a higher proportion than the high-molecular weight cardo binder.

For example, the photosensitive resin composition may contain the low-molecular weight cardo binder in 50-90 wt %, 51-90 wt %, 60-85 wt %, or 70-80 wt % relative to the mass sum of the low-molecular weight cardo binder and the high-molecular weight cardo binder. In a case where the content of the low-molecular weight cardo binder is within the above range, the formation of a pattern without residues can be attained when a pattern layer is formed of the photosensitive resin composition and the loss of film thickness can be prevented upon the development thereof.

The photosensitive resin composition according to embodiments may further contain one or more of an acrylic binder and a polyimide binder in addition to the two or more kinds of cardo binders.

The acrylic binder, which is a copolymer of a first ethylenically unsaturated monomer and a second ethylenically unsaturated monomer polymerizable therewith, is a resin containing at least one acrylic repeating unit.

As for the polyimide binder, in order to prevent excessive dissolution characteristics of polyamic acid, which is a polyimide precursor, in an alkali aqueous solution, a poly- The reactive unsaturated compound may be, for example, at least one selected from ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexane diol dimethacrylate, pentaerythritol triacrylate, pentaerythritol tetraacrylate, dipentaerythritol pentaacrylate, dipentaerythritol hexaacrylate, bisphenol A epoxy acrylate, ethylene glycol monomethyl ether acrylate, trimethylolpropane triacrylate, and trisacryloyloxyethyl phosphate, but is not limited thereto.

Commercially available products of the photo-polymerizable monomer are exemplified as follows. Examples of a mono-functional ester of (meth)acrylic acid may include Aronix M-101, M-111, and M-114 by Toagosei Chemistry Industry Co., Ltd., KAYARAD TC-110S® and TC-120S by Nippon Kayaku Co., Ltd., V-158 and V-2311 by Osaka Organic Chemical Co., Ltd., and the like. Examples of a di-functional ester of (meth)acrylic acid may include Aronix M-210, M-240, and M-6200 by Toagosei Chemistry Industry Co., Ltd., KAYARAD HDDA, HX-220, and R-604 by Nippon Kayaku Co., Ltd., V-260, V-312, and V-335 HP by Osaka Organic Chemical Co., Ltd., and the like. Examples of a tri-functional ester of (meth)acrylic acid may include Aronix M-309, M-400, M-405, M-450, M-7100, M-8030, and M-8060 by Toagosei Chemistry Industry Co., Ltd., KAYARAD TMPTA, DPCA-20, DPCA-60, and DPCA-120 by Nippon Kayaku Co., Ltd., V-295, V-300, and V-360 by Osaka Yuki Kayaku Kogyo Co. Ltd., and the like. These products may be used alone or in a mixture of two or more.

The reactive unsaturated compound may be treated with an acid anhydride to give excellent developability.

The reactive unsaturated compound may be contained in 1-40 wt % or 1-20 wt % relative to the total amount of the photosensitive resin composition. When the reactive unsaturated compound is contained within the above ranges, sufficient curing occurs upon the exposure in the pattern forming process, thereby implementing excellent reliability, excellent heat resistance, light resistance and chemical resistance of patterns, and excellent resolution and adhesion.

The photosensitive resin composition according to embodiments includes a pigment.

The pigment may be at least one of organic pigments and inorganic pigments.

For the pigment, a red pigment, a green pigment, a blue pigment, a yellow pigment, a black pigment, or the like may be used.

Examples of the red pigment may include C.I. red pigment 254, C.I. red pigment 255, C.I. red pigment 264, C.I. red pigment 270, C.I. red pigment 272, C.I. red pigment 177, C.I. red pigment 89, and the like.

Examples of the green pigment may include halogen-substituted copper phthalocyanine pigments, such as C.I. green pigment 36, C.I. green pigment 7, and the like.

Examples of the blue pigment may include copper phthalocyanine pigments, such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like.

Examples of the yellow pigment may include isoindoline-based pigments, such as C.I. yellow pigment 139, quinophthalone-based pigments, such as C.I. yellow pigment 138, nickel complex pigments, such as C.I. yellow pigment 150.

Examples of the black pigment may include lactam black, aniline black, perylene black, titanium black, carbon black and the like.

The pigments may be used alone or in a mixture of two or more thereof, and examples thereof are not limited thereto.

When a high light-shielding property is required for a pattern layer formed of the photosensitive resin composition, the black pigment may be used to efficiently perform light blocking. The black pigment may be used together with a color calibrating agent, such as an anthraquinone-based pigment, a perylene-based pigment, a phthalocyanine-based pigment, or an azo-based pigment.

A dispersing agent may also be used to disperse the pigments in the photosensitive resin composition. The pigment may be surface-pretreated with a dispersing agent before use, or the pigment may be used together with a dispersing agent added thereto during the preparation of the photosensitive resin composition.

Examples of the dispersing agent may include non-ionic dispersing agents, anionic dispersing agents, cationic dispersing agents, and the like Specific examples of the dispersing agent may include polyalkylene glycol and esters thereof, polyoxyalkylene, polyhydric alcohol ester alkylene oxide adducts, alcohol alkylene oxide adducts, sulfonic acid esters, sulfonic acid salts, carboxylic acid esters, carboxylic acid salt, alkylamide alkylene oxide adducts, alkyl amines, and the like, and these may be used alone or in a mixture of two or more thereof.

Examples of commercially available products of the dispersing agents may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the others by BYK Co., Ltd., EFKA-47, EFKA-47EA, EFKA-48, EFKA-49, EFKA-100, EFKA-400, EFKA-450, and the others by BASF Co., Ltd., Solsperse 5000, Solsperse 12000, Solsperse 13240, Solsperse 13940, Solsperse 17000, Solsperse 20000, Solsperse 24000GR, Solsperse 27000, Solsperse 28000, and the others by Zeneka Co., Ltd., and PB711, PB821, and the others by Ajinomoto Co., Ltd.

The dispersing agent may be contained in 0.1-15 wt % relative to the total amount of the photosensitive resin composition. When the dispersing agent is contained within the above range, the photosensitive resin composition may have excellent dispersibility, and thus show excellent stability, developability, and pattern formability during the manufacture of a light shielding layer.

The pigment may be pre-treated using a water-soluble inorganic salt and a wetting agent before use. When the pigment is pre-treated before use, the primary particle diameter of the pigment may be fine-sized. The pre-treatment may be carried out by performing a step of kneading the pigment together with the water-soluble inorganic salt and the wetting agent and a step of filtering and washing the pigment obtained from the kneading step. The kneading may be carried out at a temperature of 40-100° C. and the filtering and washing may be carried out by washing the inorganic salt with water or the like, followed by filtration. Examples of the water-soluble inorganic salt may include sodium chloride, potassium chloride, and the like, but are not limited thereto.

The wetting agent serves as a medium that can uniformly mix the pigment and the water-soluble inorganic salt to facilitate pulverization of the pigment. Examples of the wetting agent may include: alkylene glycol monoalkyl ethers, such as ethylene glycol monoethyl ether, propylene glycol monomethyl ether, and diethylene glycol monomethyl ether; and alcohols, such as ethanol, isopropanol, butanol, hexanol, cyclohexanol, ethylene glycol, diethylene glycol, polyethylene glycol, and glycerine polyethylene glycol. These may be used alone or in a mixture of two or more thereof.

The pigment undergoing the kneading step may have an average particle diameter of 20-110 nm. In a case where the average particle diameter of the pigment is within the above range, a fine pattern with excellent heat resistance and light resistance can be effectively formed.

The pigment may be contained in 1-40 wt %, 1-30 wt %, or 2-30 wt % relative to the total amount of the photosensitive resin composition. When the pigment is contained within the above ranges, the photosensitive resin composition can form a pattern layer with an excellent color gamut and superb curability and adhesion.

The photosensitive resin composition contains an initiator (D).

For the initiator, a photopolymerization initiator, a radical polymerization initiator, or a combination thereof may be used.

For the photopolymerization initiator, for example, at least one of acetophenone-based compounds, benzophenone-based compounds, thioxanthone-based compounds, benzoin-based compounds, oximester-based compounds, triazine-based compounds may be used.

Examples of the acetophenone-based compounds may include 2,2'-diethoxy acetophenone, 2,2'-dibutoxy acetophenone, 2-hydroxy-2-methylpropinophenone, p-t-butyltrichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like. Examples of the benzophenone-based compounds may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compounds may include thioxanthone, 2-chlorothioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compounds include benzoin, benzoin methyl ether, benzoin ethyl ether, benzoin isopropyl ether, benzoin isobutyl ether, benzyl dimethyl ketal, and the like. Examples of the triazine-based compounds include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-trichloromethyl(piperonyl)-6-triazine, 2-4-trichloromethyl(4'-methoxystyryl)-6-triazine, and the like.

As for the photopolymerization initiator, carbazole-based compounds, diketone-based compounds, sulfonium borate-based compounds, diazo-based compounds, imidazole-based compounds, non-imidazole-based compounds, and the like may be used in addition to the above compounds. For the radical polymerization initiator, peroxide-based compounds, azobis-based compounds, and the like may be used.

Examples of the peroxide-based compounds include: ketone peroxides, such as methylethylketone peroxide, methylisobutylketone peroxide, cyclohexanone peroxide, methyl cyclohexanone peroxide, and acetyl acetone peroxide; diacyl peroxides, such as isobutyryl peroxide, 2,4-dichlorobenzoyl peroxide, o-methyl benzoyl peroxide, and bis-3,5,5-trimethyl hexanoyl peroxide; hydro peroxides, such as 2,4,4,-trimethylpentyl-2-hydroperoxide, diisopropyl benzenehydro peroxide, cumenehydro peroxide, and t-butyl hydro peroxide; dialkyl peroxides, such as dicumyl peroxide, 2,5-dimethyl-2,5-di(t-butylperoxy)hexane, 1,3-bis(t-butyloxyisopropyl)benzene, t-butylperoxyvaleric acid, and n-butylester; alkyl peresters, such as 2,4,4-trimethylpentyl peroxyphenoxyacetate, α-cumyl peroxyneodecanoate, t-butyl peroxybenzoate, and di-t-butyl peroxytrimethyl adipate; and percarbonates, such as di-3-methoxybutyl peroxydicarbonate, di-2-ethylhexyl peroxydicarbonate, bis-4-t-butylcyclohexyl peroxydicarbonate, diisopropyl peroxydicarbonate, acetyl cyclohexyl sulfonyl peroxide, and t-butyl peroxyaryl carbonate.

Examples of the azobis-based compounds include 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile), 4,4'-azobis(4-cyanovaleric acid), and the like. The initiator may be used together with a photosentizer, which undergoes excitation through light absorption and then transmits such energy to thereby cause a chemical reaction. Examples of the photo-sensitizer include tetraethylene glycol bis-3-mercapto propionate, pentaerythritol tetrakis-3-mercapto propionate, dipentaerythritol tetrakis-3-mercapto propionate, and the like.

The initiator may be contained in 0.01-10 wt % or 0.1-5 wt % relative to the total amount of the photosensitive resin composition. When the initiator is contained within the above ranges, the photosensitive resin composition may undergo sufficient curing upon the exposure in the pattern forming process using the photosensitive resin composition, thereby providing excellent reliability, having excellent heat resistance, light resistance, chemical resistance of patterns, showing excellent resolution and adhesion, and prevention a deterioration in transmittance due to a non-reactive initiator.

The photosensitive resin composition according to embodiments includes a solvent.

For the solvent, materials having compatibility with the cardo binder, the reactive unsaturated compound, the pigment, but not reacting therewith may be used.

Examples of the solvent may include: alcohols, such as methanol and ethanol; ethers, such as dichloroethyl ether, n-butyl ether, diisoamyl ether, methylphenyl ether, and tetrahydrofuran; glycol ethers, such as ethylene glycol monomethyl ether and ethylene glycol monoethyl ether; cellosolve acetates, such as methyl cellosolve acetate, ethyl cellosolve acetate, and diethyl cellosolve acetate; carbitols, such as methyl ethyl carbitol, diethyl carbitol, diethylene glycol monomethyl ether, diethylene glycol monoethyl ether, diethylene glycol dimethyl ether, diethylene glycol methyl ethyl ether, and diethylene glycol diethyl ether; propylene glycol alkyl ether acetates, such as propylene glycol methyl ether acetate and propylene glycol propyl ether acetate; aromatic hydrocarbons, such as toluene and xylene; ketones, such as methyl ethyl ketone, cyclohexanone, 4-hydroxy-4-methyl-2-pentanone, methyl-n-propyl ketone, methyl-n-butyl ketone, methyl-n-amyl ketone, and 2-heptanone; saturated aliphatic monocarboxylic acid alkyl esters, such as ethyl acetate, n-butyl acetate, and isobutyl acetate; lactate esters, such as methyl lactate and ethyl lactate; oxyacetic acid alkyl esters, such as methyl oxyacetate, ethyl oxyacetate, and butyl oxyacetate; alkoxy acetate alkyl esters, such as methoxy methyl acetate, methoxy ethyl acetate, methoxy butyl acetate, ethoxy methyl acetate, and ethoxy ethyl acetate; 3-oxy alkyl propionate esters, such as 3-oxy methyl propionate and 3-oxy ethyl propionate; 3-alkoxy alkyl propionate esters, such as 3-methoxy methyl propionate, 3-methoxy ethyl propionate, 3-ethoxy ethyl propionate, and 3-ethoxy methyl propionate; 2-oxy alkyl propionate esters, such as 2-oxy methyl propionate, 2-oxy ethyl propionate, and 2-oxy propyl propionate; 2-alkoxy alkyl propionate esters, such as 2-methoxy methyl propionate, 2-methoxy ethyl propionate, 2-ethoxy ethyl propionate, and 2-ethoxy methyl propionate; 2-oxy-2-methyl propionate esters, such as 2-oxy-2-methyl methyl propionate, and 2-oxy-2-methyl ethyl propionate; monooxy monocarboxylic acid alkyl esters of 2-alkoxy-2-methyl alkyl propionate, such as 2-methoxy-2-methyl methyl propionate and 2-ethoxy-2-methyl ethyl propionate; esters, such as 2-hydroxy ethyl propionate, 2-hydroxy-2-methyl ethyl propionate, hydroxy ethyl acetate, and 2-hydroxy-3-methyl methyl butanoate; and ketonate esters, such as ethyl pyruvate. In addition, examples of the solvent may include high-boiling point solvents, such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acethylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, and phenyl cellosolve acetate.

Of the solvents, considering compatibility and reactivity, glycol ethers, such as ethylene glycol monoethyl ether; ethylene glycol alkyl ether acetates, such as ethyl cellosolve acetate; esters, such as ethyl 2-hydroxypropionate; carbitols, such as diethylene glycol monomethyl ether; propylene glycol alkyl ether acetates, such as propylene glycol methyl ether acetate and propylene glycol propyl ether acetate may be used. The solvent may be contained in a balance amount, specifically, 50-90 wt %, relative to the total amount of the photosensitive resin composition. When the solvent is contained within the above range, the photosensitive resin composition has an appropriate viscosity, leading to excellent processability in the manufacture of a light shielding layer.

Other embodiments of the present disclosure can provide a display device.

A display device according to embodiments of the present disclosure includes a pattern layer containing a polymerization reaction product of the photosensitive resin composition.

In a display device according to embodiments of the present disclosure, the contents of the photosensitive resin composition overlap those of the above-described photosensitive resin composition according to embodiments of the present disclosure, and thus descriptions of the overlapping contents therebetween are omitted.

The polymerization reaction product of the photosensitive resin composition may be, for example, formed by a process in which a photosensitive resin composition is applied to a TFT substrate and the applied photosensitive resin composition is cured.

The pattern layer can have an excellent resolution and a higher taper angle by containing a polymerization reaction product of the photosensitive resin composition.

The display device may include a plurality of sub-pixels, and the pattern layer may be a pixel defining layer configured to divide the plurality of sub-pixels from each other.

For example, light emitting elements are disposed in the sub-pixels of the display device, and the light emitting elements may be organic light emitting elements. In the organic light emitting element, for example, a first electrode, an organic layer, and a second electrode may be sequentially stacked. In such an example, the pattern layer may be disposed on the first electrode, and the pattern layer may have openings on the first electrode. The organic layer may be disposed in the openings and on the first electrode, and the second electrode may be disposed on the organic layer. Since light emitting regions of the sub-pixels are determined by opening regions of the pattern layer, the above-described pattern layer may be a pixel defining layer. The pattern layer may also be a light shielding layer that shields light.

A pattern layer according to an embodiment of the present disclosure may have a high taper angle. For example, a pattern layer according to an embodiment of the present disclosure may have a taper angle of 20-40 degrees. The taper angle may be an inclination angle of a site where tapering starts with respect to a direction parallel to a display surface.

The pattern layer, which is the above-described pixel defining layer, has openings, and a taper portion that connects an opening portion and a non-opening portion has a taper angle. A pattern layer according to an embodiment of the present disclosure contains a polymerization reaction product of the above-described photosensitive resin composition, and the above-described photosensitive resin composition can form a pattern layer without residues, and the melting flow is suppressed in the pattern forming procedure, thereby implementing a high taper angle. Therefore, the pattern layer has a high taper angle as described above, leading to a reduction in length of a taper portion, thereby reducing the interval between opening portions. Therefore, sub-pixels can be densely arranged, so that a display can have a high resolution.

Although the above description is only an illustrative description of the technical idea of the present disclosure, those having ordinary knowledge in the technical field of the present disclosure will appreciate that various modifications, additions and substitutions are possible, without departing from the scope and spirit of the disclosure as disclosed in the accompanying claims. Therefore, the embodiments disclosed in the present disclosure are intended to illustrate the scope of the technical idea of the present disclosure, and the scope of the technical idea of the present disclosure is not limited by the embodiments. The protection scope of the present disclosure should be construed based on the accompanying claims, and all of the technical ideas included within the scope equivalent to the claims should be construed as being included within the right scope of the present disclosure.

Hereinafter, synthetic examples and examples according to the present disclosure are specifically described, but synthetic examples and examples of the present disclosure are not limited thereto.

Synthetic Example 1: (Preparation of 9,9-bis[4-(glycidyloxy)phenyl]fluorine of Formula 6)

To a 300 ml, 3-neck round bottom flask equipped with a distillation tube, 20 g of 9,9'-bisphenolfluorene (Sigma-Aldrich), 8.67 g of glycidyl chloride (Sigma-Aldrich), and 30 g of anhydrous potassium carbonate were added together with 1000 ml of dimethylformamide, and then the temperature was raised to 80° C., followed by reaction for 4 hours. Then, the temperature was lowered to 25° C., followed by filtration of the reaction solution, and then the filtrate was added dropwise to 100 ml of water while stirring. The precipitated powder was filtered, washed with water, and then dried under reduced pressure at 40° C., thereby obtaining 25 g of 9,9-bis[4-(glycidyloxy)phenyl]fluorine of Formula 6. The obtained power showed a purity of 98% as a result of purity analysis by HPLC.

[Formula 6]

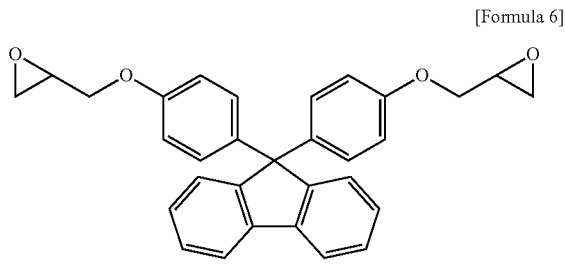 [SMILES: c1ccc2c(c1)-c1ccccc1C2(c1ccc(OCC2CO2)cc1)c1ccc(OCC2CO2)cc1]

Synthetic Example 2: Preparation of Low-Molecular Weight Cardo Binder Resin (Polymer A-1)

(Preparation of low-molecular weight cardo binder resin of Formula 7; A-1) To a 300 ml, 3-neck round bottom flask equipped with a distillation tube, 25 g (54 mmol) of compound 1 obtained in Synthetic Example 1, 8 g of acrylic acid (Daejung Chemical & Metals), 0.2 g of benzyl triethyl ammonium chloride (Daejung Chemical & Metals), and 0.2 g of hydroquinone (Daejung Chemical & Metals) were added together with 52 g of propylene glycol methyl ether acetate (Sigma-Aldrich), followed by stirring at 110° C. for 6 hours. After the reaction was completed, 8 g of biphenyl tetracarboxylic acid dianhydride (Mitsubishi Gas) and 1.8 g of tetrahydrophthalic acid (Sigma-Aldrich) were added, followed by again stirring at 110° C. for 6 hours. After the reaction was completed, the reaction solution was collected and analyzed, thereby obtaining a cardo binder resin having a molecular weight of 4,500, a structure as shown in Formula 7 below, and a solid content of 45%.

Synthetic Example 3: Preparation of High-Molecular Weight Cardo Binder Resin (Polymer A-2)

To a 300 ml, 3-neck round bottom flask equipped with a distillation tube, 25 g (54 mmol) of compound 1 obtained by the same experiment as in Synthetic Example 1, 8 g of acrylic acid (Daejung Chemical & Metals), 0.2 g of benzyl triethyl ammonium chloride (Daejung Chemical & Metals), and 0.2 g of hydroquinone (Daejung Chemical & Metals) were added together with 52 g of propylene glycol methyl ether acetate (Sigma-Aldrich), followed by stirring at 110° C. for 6 hours. After the reaction was completed, 10 g of biphenyl tetracarboxylic acid dianhydride (Mitsubishi Gas) and 0.8 g of tetrahydrophthalic acid (Sigma-Aldrich) were added, followed by again stirring at 110° C. for 6 hours. After the reaction was completed, the reaction solution was collected and analyzed, thereby obtaining a cardo binder resin having a molecular weight of 8,500, a structure as shown in Formula 7 above, and a solid content of 44%.

Synthetic Examples 4 to 9: Synthesis of Silane Derivatives

Synthetic Example 4 (Preparation of Compound 1-1': 6-(trimethoxysilyl)-1-hexanethiol)

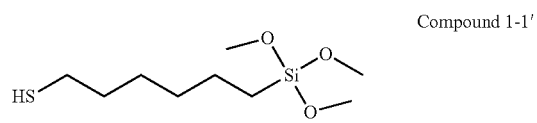

Compound 1-1'

To a 3-neck round bottom flask equipped with a distillation tube connected to cooling water, 20 g (0.147 mol) of trichloro silane (Gelest) and 17.51 g (0.147 mol) of 6-chloro-1-hexene (Aldrich) were dissolved in 200 ml of ethyl acetate, and 0.02 g of a platinum(0)-1,3-divinyl-1,1,3,3-tetramethyldisiloxane complex solution (2 wt % in xylene, Aldrich) was added, and the temperature was raised to 75° C. with addition of nitrogen. After 5 hours of the reaction, the solution was filtered through a 0.1-μm membrane of Teflon to remove the platinum catalyst. Thereafter, 15.6 g (0.487 mol) of methanol was added dropwise at room temperature for 30 minutes, and the temperature was again raised to 50° C., followed by additional reaction for 2 hours.

[Formula 7]

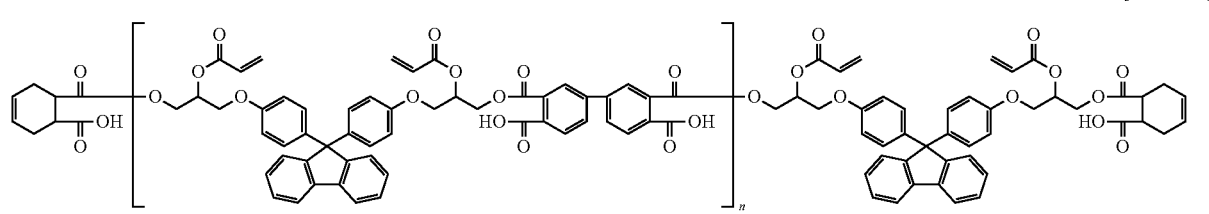

Then, the reaction solution was distilled under reduced pressure to remove the solvent. To an autoclave, 24 g (0.1 mol) of the 6-chlorohexyltrimethoxysilane thus obtained, 8 g (0.15 mol) of sodium methoxide (Aldrich), 187 ml (0.15 mol) of a hydrogen sulfide THF solution (0.8 M), and 100 ml of methanol were added, followed by reaction at 100° C. for 2 hours. After the reaction solution was cooled, 100 ml of hydrogen chloride in methanol (1.25 M) was added dropwise for 30 minutes, and the generated salt was removed by filtration, followed by distillation under reduced pressure, thereby obtaining 23 g of 6-(trimethoxysilyl)-1-hexanethiol.

Synthetic Example 5 (Preparation of Compound 1-2': 9-(trimethoxysilyl)-1-nonanethiol)

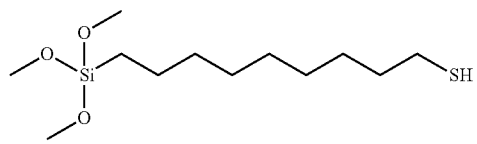

Compound 1-2'

The same procedure as in Synthetic Example 4 was carried out except that 23.7 g (0.147 mol) of 9-chloro-1-nonene (AK Scientific) was used instead of 6-chloro-1-hexene.

Synthetic Example 6 (Preparation of Compound 1-3': 12-(trimethoxysilyl)-1-dodecanethiol)

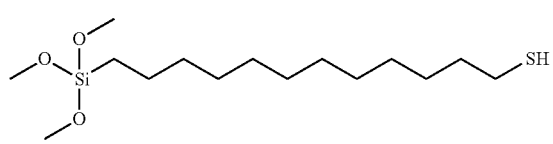

Compound 1-3'

The same procedure as in Synthetic Example 4 was carried out except that 30 g (0.147 mol) of 12-chloro-1-dodecene (Atomax Chemicals) was used instead of 6-chloro-1-hexene.

Synthetic Example 7 (Preparation of Compound 1-4': 6-(triethoxysilyl)-1-hexanethiol)

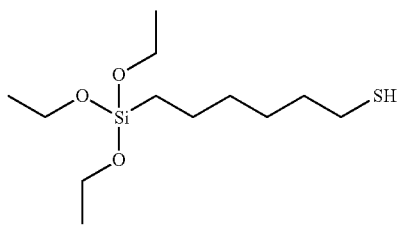

Compound 1-4'

The same procedure as in Synthetic Example 4 was carried out except that after the removal of platinum, 22.4 g (0.487 mol) of ethanol (Aldrich) was used instead of methanol.

Synthetic Example 8 (Preparation of Compound 1-5': 6-(tributhoxysilyl)-1-hexanethiol)

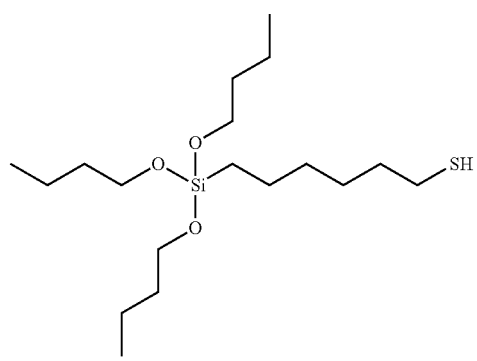

Compound 1-5'

The same procedure as in Synthetic Example 4 was carried out except that after the removal of platinum, 36 g (0.487 mol) of 1-butanol (Aldrich) was used instead of methanol.

Synthetic Example 9 (Preparation of Compound 1-6': 6-(dimethoxymethylsilyl)-1-hexanethiol)

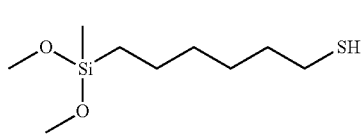

Compound 1-6'

The same procedure as in Synthetic Example 4 was carried out except that 18 g (0.147 mol) of dichloromethylsilane was used instead of trichlorosilane.

Synthetic Example 10 (Preparation of Cardo Binder Resin Containing Silane Derivative of Polymer B-1)

Synthetic Example 10-1: Preparation of Cardo Binder Resin (Polymer B)

To a 300 ml, 3-neck round bottom flask equipped with a distillation tube, 25 g (54 mmol) of compound 1 obtained in Synthetic Example 1, 8 g of acrylic acid (Daejung Chemical & Metals), 0.2 g of benzyl triethyl ammonium chloride (Daejung Chemical & Metals), and 0.2 g of hydroquinone (Daejung Chemical & Metals) were added together with 52 g of propylene glycol methyl ether acetate (Sigma-Aldrich), followed by stirring at 110° C. for 6 hours. After the reaction was completed, 8.5 g of biphenyl tetracarboxylic acid dianhydride (Mitsubishi Gas) and 1.55 g of tetrahydrophthalic acid (Sigma-Aldrich) were added, followed by again stirring at 110° C. for 6 hours. After the reaction was completed, the reaction solution was collected and analyzed, thereby obtaining a cardo binder resin having a molecular weight of 5,500, a structure as shown in Formula 7 above, and a solid content of 45%.

Synthetic Example 10-2
After 6.36 g (34 mmol) of KBM 803 (3-(trimethoxysilyl)-1-propanethiol, Shinetsu), which is compound 1-7' below, was added to the cardo binder solution obtained in Synthetic Example 10-1, the temperature was raised to 60° C., followed by stirring for 4 hours, thereby obtaining cardo binder resin B-1 having a substituted silane group, as shown in Formula 8.
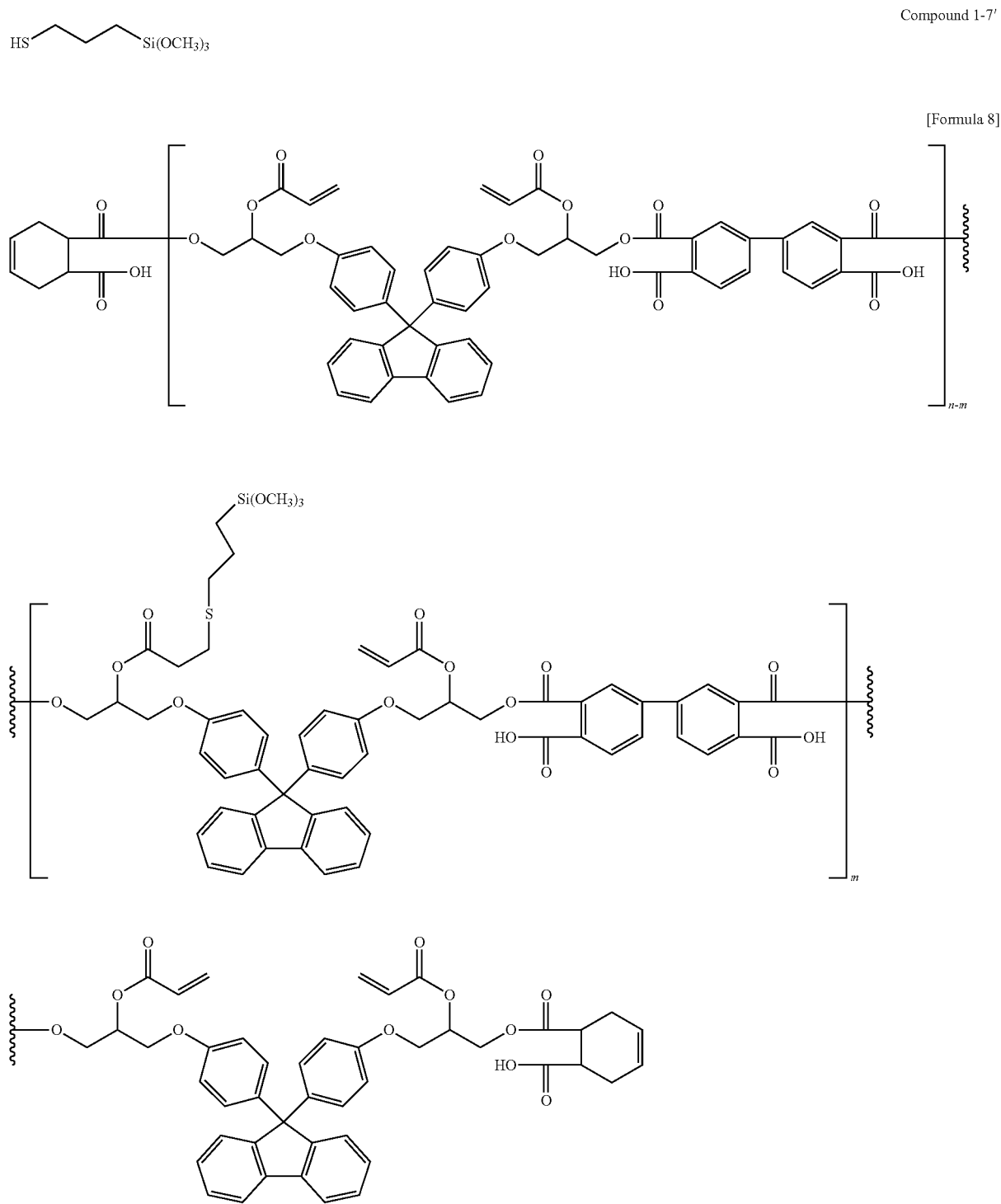

Synthetic Example 11 (Preparation of Cardo Binder Resin of Polymer B-2)
After 8.1 g (34 mmol) of 6-(trimethoxysilyl)-1-hexanethiol (Compound 1-1') was added to the cardo binder solution obtained in Synthetic Example 10-1, the temperature was raised to 60° C., followed by stirring for 4 hours, thereby obtaining cardo binder resin B-2 having substituted silane, as shown in Formula 9.
[Formula 9]
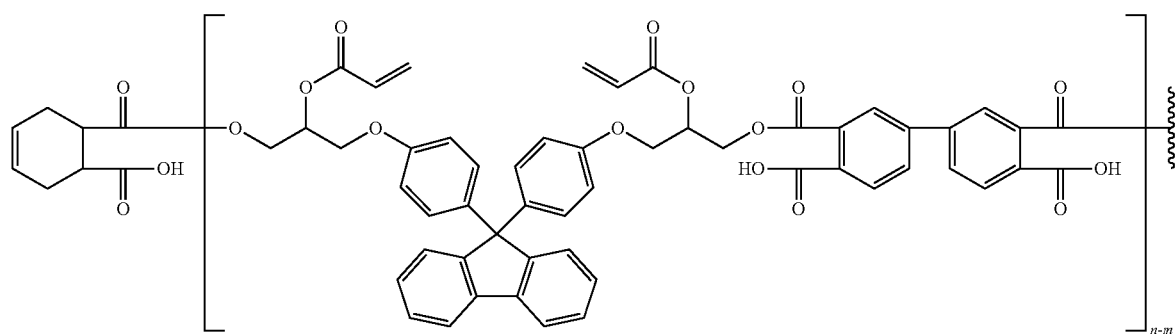
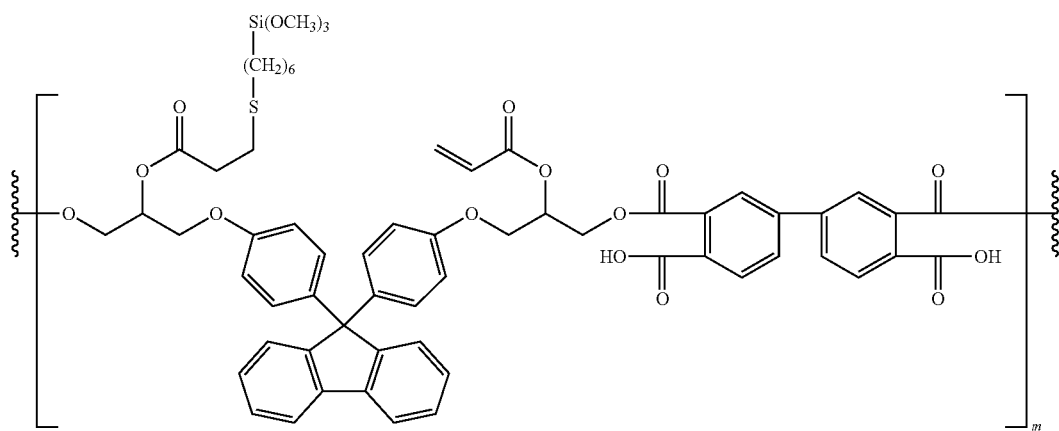
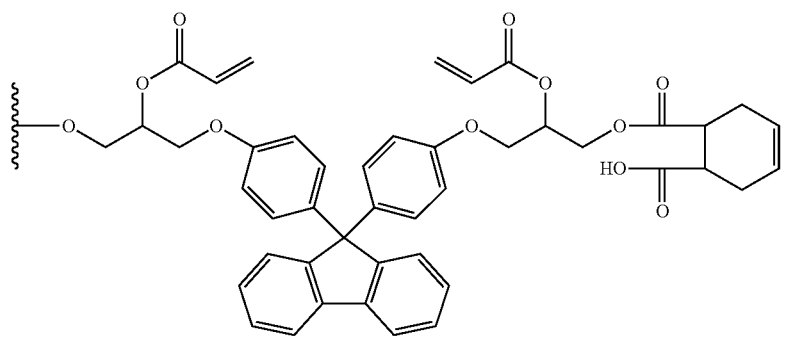

Synthetic Example 12 (Preparation of Cardo Binder Resin of Polymer B-3)

After 9.53 g (34 mmol) of 6-(triethoxysilyl)-1-hexanethiol (Compound 1-4') was added to the cardo binder solution obtained in Synthetic Example 10-1, the temperature was raised to 60° C., followed by stirring for 4 hours, thereby obtaining cardo binder resin B-3 having substituted silane, as shown in Formula 10.

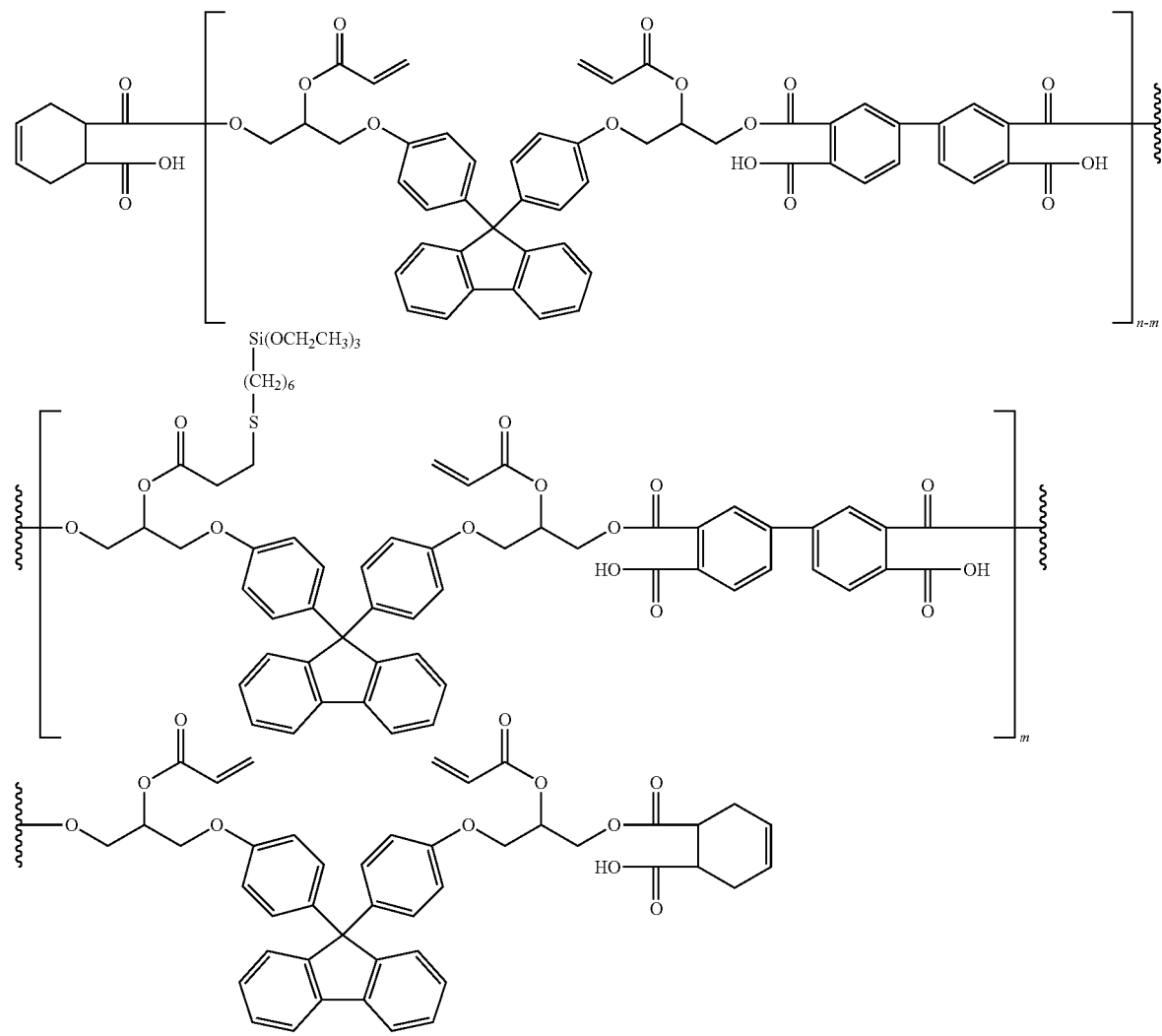

[Formula 10]

Evaluation 1 of Preparation of Photosensitive Resin Composition

TABLE 1

|  | Com. Ex. 1 | Com. Ex. 2 | Com. Ex. 3 | Com. Ex. 4 | Com. Ex. 5 | Example 1 | Example 2 | Example 3 |
|---|---|---|---|---|---|---|---|---|
| Black pigment disperison liquid (SKC Ht&m) | 37 | 37 | 37 | 37 | 37 | 37 | 37 | 37 |
| Miraemer M600(Miwon Specialty Chemical) | 3.5 | 3.5 | 3.5 | 3.5 | 3.5 | 3.5 | 3.5 | 3.5 |
| Oxe-02 (BASF) | 0.5 | 0.5 | 0.5 | 0.5 | 0.5 | 0.5 | 0.5 | 0.5 |

TABLE 1-continued

| | Com. Ex. 1 | Com. Ex. 2 | Com. Ex. 3 | Com. Ex. 4 | Com. Ex. 5 | Example 1 | Example 2 | Example 3 |
|---|---|---|---|---|---|---|---|---|
| Polymer A-1 (Low-molecular weight cardo binder) | 10 | | | | | 8 | 7.3 | 7.3 |
| Polymer A-2 (High-molecular weight cardo binder) | | 10 | | | | 2 | 2 | 2 |
| Polymer B(Silane-containing cardo bnder) | | | 10 | | | | | 0.7 |
| Polymer C(Polyimide) | | | | 10 | | | | |
| Polymer D(Acrylate polymer) | | | | | 10 | | | 0.7 |
| propyleneglycolmethylacetate | 49 | 49 | 49 | 49 | 49 | 49 | 49 | 49 |

In Table 1, Polymer C and Polymer D are as follows.
Polymer C (Polyimide/Mw: 3,200)

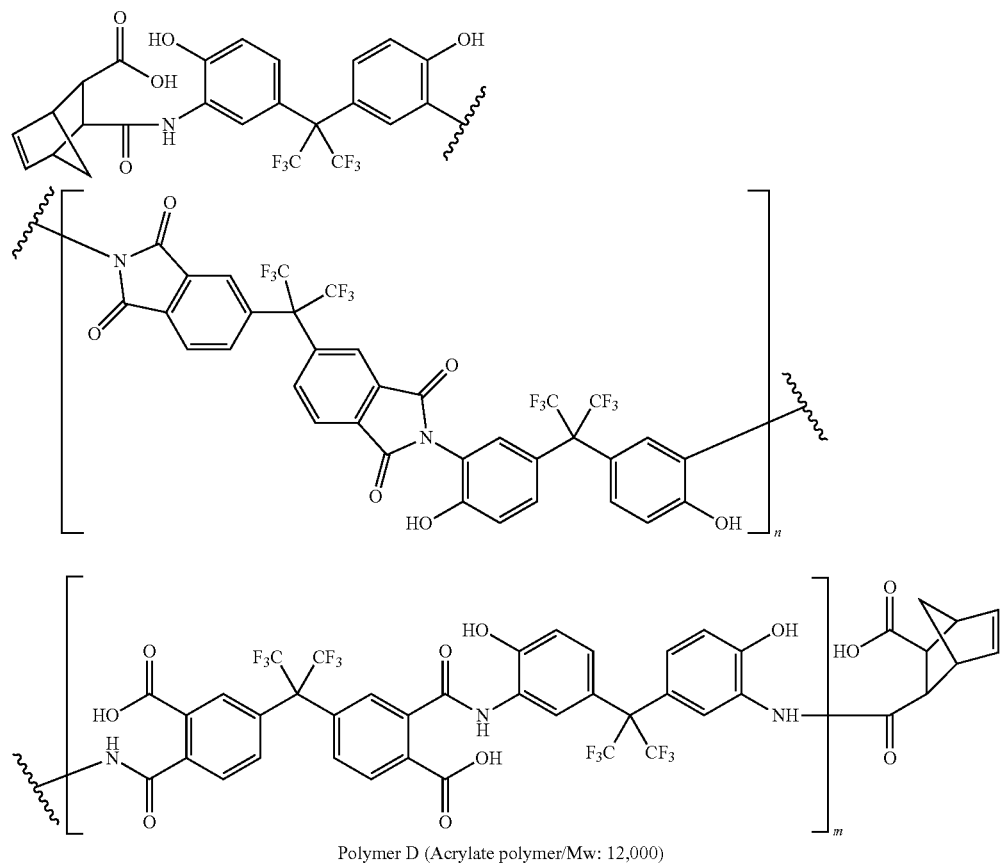

Polymer D (Acrylate polymer/Mw: 12,000)

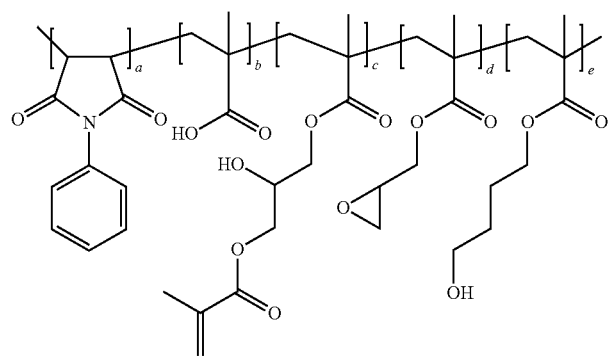

The manufacturing method of light shielding layers using the above compositions is as follows.

(1) Step of Application and Coating Formation

The above-described black photosensitive resin composition was applied onto a washed glass substrate of 10 cm×10 cm to a thickness of 1.5 μm by using a spin coater, and then heated at a temperature of 100° C. for 1 minute to remove a solvent, thereby forming a coating.

(2) Step of Exposure

To form a necessary pattern on the obtained coating, a mask with a predetermined shape was interposed, and then irradiated with an active energy ray of 190-500 nm. MA-6 (SUSS) was used for an exposure machine, with an exposure dose of 100 mJ/cm$^2$.

(3) Step of Development

Following the step of exposure, development was carried out by dipping in an AX 300 MIF developer (AZEM) at 25° C. for 1 minute, and then washing was carried out with water, so that an unexposed portion is dissolved and removed to leave only an exposed portion, thereby forming an image pattern.

(4) Step of Post-Treatment

In order to obtain a pattern excellent in terms of heat resistance, light resistance, adhesion, crack resistance, chemical resistance, high strength, storage stability, and the like, from the image pattern obtained by the development, post baking was carried out at 230° C. for 30 minutes.

As for the patterns obtained through the above steps, pattern images therefor were drawn using an optical microscope (Nicon), and taper angles of the patterns were compared using SEM (Hitachi).

Referring to the results of FIGS. 1 and 2, which were obtained by analyzing the pattern images for light shielding layers manufactured from the compositions shown in Table 1, it was verified that very many residues were present on the manufactured patterns or the sizes of the patterns were reduced (deterioration in adhesion) when Polymer A-1, Polymer A-2, Polymer B-1, Polymer C, and Polymer D were used alone compared with Examples 1 to 3 containing a mixture composition of a cardo binder having a low molecular weight and a cardo binder having a high molecular weight.

More specifically from the above results, when Polymer A 1 (cardo binder having a low molecular weight) was used alone, a black pigment was not completely washed out to leave many residues on the image after development, and the linearity of the edge portion of the pattern was excellent.

When Polymer A-2 (cardo binder having a high molecular weight) was used alone, the development time was reduced by about 2 times compared with Polymer A-1, causing poor development. Since the development was less done in the same amount of development time, the size of the hole pattern was reduced. However, the residues on the center portion of the pattern were reduced compared with Polymer A-1. (Since the breaking point of A-1 was between 10-15 seconds and the breaking point of A-2 was between 50 seconds or longer, the development was less done.)

When Polymer B-1 (cardo binder containing silane) was used alone, the pattern had a pattern formation characteristic corresponding to an intermediate level between those in Polymer A-1 and Polymer A-2, and also had many residues left on the edge. (The breaking point of Polymer B-1 being less than 10 seconds)

When Polymer C (polyimide) was used alone, the breaking point was slower compared with Polymer A-2, and thus Polymer C was identified to be a material very difficult to develop, and identified to be a material that is least developed among the compounds of Comparative Examples 1 to 5. (Many residues being present on the edge and center portion of the pattern) When Polymer D (acryl derivative) was used alone, the development time was about 12 seconds corresponding to an intermediate level between those in Polymer A-1 and Polymer B, and the adhesion was lower compared with cardo binders (Polymers A-1, A-2, and B-1), and many residues were also present on the edge.

When the pattern image of Example 1 in which Polymer A-1 and Polymer A-2 were mixed was compared with the pattern images of Comparative Examples 1 and 2 in which Polymers A-1 and A-2 were used alone, respectively, the pattern of Example 1 showed excellent developability and especially no residues on the edge and the center portion, thereby obtaining a clean pattern.

Example 2 (Example 1+Polymer B-1) showed a very small difference in pattern size, but showed excellent developability, no pattern residues, and excellent adhesion.

When Example 3 (Example 1+Polymer D1) was used, the pattern size was smaller compared with Examples 1 and 2, but an excellent pattern could be obtained without problems with respect to developability and residues.

The results of comparing taper angles in Examples 1 to 3 by using SEM images were tabulated in FIG. 3.

FIG. 3 shows pattern images of Examples 1 to 3 and SEM cross-sectional images after developing and after curing for Examples 1 to 3.

In FIG. 3, the taper angles were determined in the manner described in FIG. 4.

As shown in the results of the previously mentioned figures, one of the main reasons why different performances (pattern developability, residue problems, and low taper angles) were shown depending on the kind of resin (binder) is considered to be due to differences in overflow and taper angle.

When a pattern is formed by development in an aqueous alkali solution and then undergoes post-baking (thermal curing), the pattern flows by heat at 250° C. A phenomenon in which the end portion of the pattern flows is called melting flow.

The overflow refers to a phenomenon in which a pattern heavily flows in the melting flow. When the pattern overflows after thermal curing, hole patterns severely collapse, and thus an opening of the pattern was smaller, resulting in a small opening region of a sub-pixel.

It was also confirmed that the taper angle increased as the melting flow decreased, and conversely, the taper angle decreased as the melting flow increased. When the taper angle was too low, the opening of the pattern became smaller, resulting in a small opening region in a sub-pixel.

The pattern images formed of the examples and comparative examples are shown in FIG. 5.

Referring to FIG. 5, compared with Comparative Examples 1 and 2 in which Polymer A-1 and Polymer A-2 were used alone, Examples 1 and 2 in which the two kinds were used in mixture showed more excellent adhesion, leading to fine patterns.

The adhesion is a measure to determine how finely squares and line patterns are developed from 1 μm to 11 μm. The resolution of patterns formed was a level of up to about 8 μm when Polymers A-1 and A-2 were used alone; a level of 5-6 μm when Polymers A-1 and A-2 were mixed; and a level of up to 1 μm when three kinds of cardo binders including Polymers B were mixed.

Evaluation 2 of Preparation of Photosensitive Resin Composition

Examples 4 to 6: Evaluation of Performance (Taper Angle) According to Ratio of Polymer A-1 (Low Molecular Weight) and Polymer A-2 (High Molecular Weight)

TABLE 2

|  | Example 4 | Example 5 | Example 6 |
|---|---|---|---|
| Black pigment disperison liquid (SKC Ht &m)(SKC Ht &m) | 37 | 37 | 37 |
| Miraemer M600(Miwon Specialty Chemical) | 3.5 | 3.5 | 3.5 |
| Oxe-02 (BASF) | 0.5 | 0.5 | 0.5 |
| Polymer A-1 (Low-molecular weight cardo binder) | 7 | 5 | 3 |
| Polymer A-2 (High-molecular weight cardo binder) | 3 | 5 | 7 |
| propyleneglycolmethylacetate | 49 | 49 | 49 |

Referring to Table 2 and FIG. 6, pattern developability, residues, and taper angle were compared according to the mixing ratio of Polymer A-1 and Polymer A-2. (Examples 4 to 6)

Examples 4 to 6 used low-molecular weight (MW: 4,500) cardo binder A-1 and high-molecular weight (MW: 8,500) cardo binder A-2 at 7:3, 5:5, and 3:7, respectively.

Among Examples 4 to 6, Example 4 using the largest proportion of Polymer A-1 showed a largest pattern size of 17.5 μm, no residues, and an excellent taper angle of 33 degrees. (Resolution: 5 § -, breaking point: 17 seconds)

In Example 5 using Polymers A-1 and A-2 at the same proportion, the pattern size was 16.9 μm, and residues were absent in the center portion of the pattern but residues were present on the edge. (The breaking point increased to 21 seconds since the amount of Polymer A-2 was increased compared with Example 4)

In Example 6, the pattern size was the smallest, 14.7 μm, and many residues were present in both the center portion and the edge of the pattern. The reason was that as Polymer A-2 was used more than Polymer A-1, the breaking point was slowest, 40 seconds or more, and as a result, many residues were generated and the hole pattern size became smaller.

Therefore, as for compounds of the present disclosure, it was verified that a photosensitive resin composition containing Polymer A-1, which is a low-molecular weight cardo binder, more than Polymer A-2, which is a high-molecular weight cardo binder, showed excellent developability and adhesion of patterns.

What is claimed is:

1. A photosensitive resin composition comprising: (A) two or more kinds of cardo binders containing a repeating unit represented by Formula 1 below and having different molecular weights; (B) a reactive unsaturated compound; (C) a pigment; (D) an initiator; and (E) a solvent:

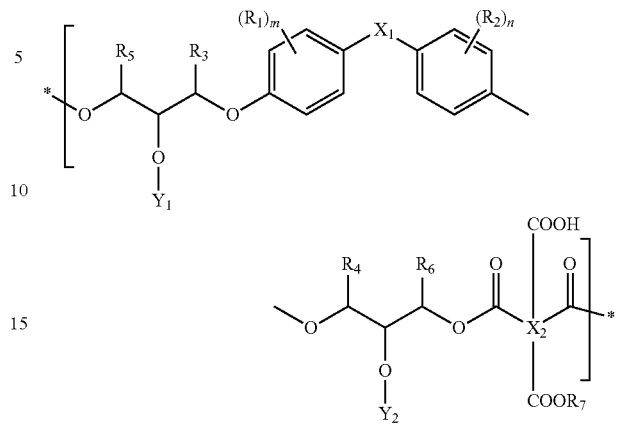

[Formula 1]

1) "*" indicates a portion where a bond is linked to the repeating unit;
2) $R_1$ and $R_2$ are each independently selected from the group consisting of deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_6$-$C_{30}$ aryloxy group;
3) $R_3$ to $R_6$ are each independently selected from the group consisting of hydrogen, deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_6$-$C_{30}$ aryloxy group;
4) $R_7$ is selected from the group consisting of hydrogen, deuterium, a $C_1$-$C_{60}$ alkyl group, a $C_2$-$C_{60}$ alkenyl group, an acrylic group, and a methacrylic group;
5) M and n are each independently an integer of 0 to 4, wherein adjacent R's may be linked to each other to form a monocyclic or polycyclic ring when m is 2 or greater, and Res may be linked to each other to form a monocyclic or polycyclic ring when n is 2 or greater;
6) $X_2$ is an acid anhydride residue or acid dianhydride residue;
7) $X_1$ is represented by Formula 2 below;
8) $Y_1$ and $Y_2$ are each independently selected from the group consisting of hydrogen, deuterium, Formula 3 below; and Formula 4 below;

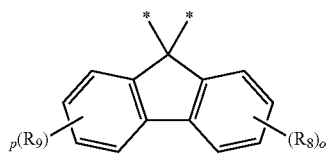

[Formula 2]

9) $R_8$ and $R_9$ are each independently selected from the group consisting of deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, a $C_2$-$C_{60}$ alkenyl group, a $C_2$-$C_{60}$ alkynyl group, a $C_1$-$C_{60}$ alkoxyl group, and a $C_2$-$C_{60}$ alkenyl group;

10) o and p are each independently an integer of 0 to 4, wherein adjacent $R_8$'s may be linked to each other to form a monocyclic or polycyclic ring when o is 2 or greater; and $R_9$'s may be linked to each other to form a monocyclic or polycyclic ring when p is 2 or greater;

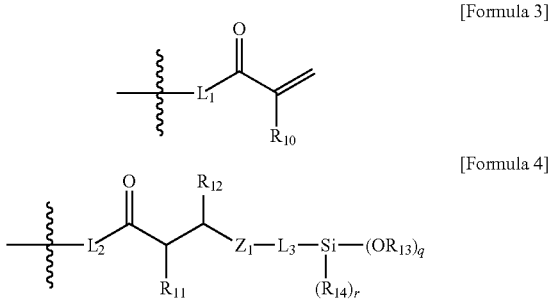

[Formula 3]

[Formula 4]

11) $L_1$ to $L_3$ are each independently selected from the group consisting of a single bond, a $C_1$-$C_{60}$ alkylene group, and a $C_6$-$C_{60}$ arylene group;
12) $R_{10}$ to $R_{12}$ are each independently selected from the group consisting of hydrogen, deuterium, a halogen group, a $C_6$-$C_{60}$ aryl group, a $C_2$-$C_{60}$ heterocyclic group containing at least one heteroatom of O, N, S, Si, and P, a fused ring group of a $C_3$-$C_{60}$ aliphatic ring and a $C_6$-$C_{60}$ aromatic ring, a $C_1$-$C_{60}$ alkyl group, and a $C_1$-$C_{60}$ alkoxyl group;
13) $R_{13}$ is either a methyl group or an ethyl group;
14) $R_{14}$ is either a methoxy group or an ethoxy group;
15) $Z_1$ is S or O; and
16) q and r are each independently an integer of 0 to 3, and q+r=3.

2. The photosensitive resin composition of claim 1, wherein the two or more kinds of cardo binders comprise a low-molecular weight cardo binder having a weight average molecular weight of 3000-5000 and a high-molecular weight cardo binder having a weight average molecular weight of 7000-9000.

3. The photosensitive resin composition of claim 2, wherein the low-molecular weight cardo binder is contained in 50-90 wt % relative to the sum of the mass of the low-molecular weight cardo binder and the mass of the high-molecular weight cardo binder.

4. The photosensitive resin composition of claim 1, wherein, as for at least one of the two or more kinds of cardo binders, at least one of $Y_1$ and $Y_2$ is represented by Formula 4 and the weight average molecular weight is 5000-7000.

5. The photosensitive resin composition of claim 1, wherein, as for the two or more kinds of cardo binders, at least one of $Y_1$ and $Y_2$ is Formula 3.

6. The photosensitive resin composition of claim 1, further comprising one or more of an acrylic binder and a polyimide binder.

7. The photosensitive resin composition of claim 6, wherein the acrylic binder has a weight average molecular weight of 9000-13000, and wherein the polyimide binder has a weight average molecular weight of 1500-3900.

8. The photosensitive resin composition of claim 1, wherein the two or more kinds of cardo binders (A) is contained in 1-30 wt %; the reactive unsaturated compound (B) is contained in 1-40 wt %; the pigment (C) is contained in 1-30 wt %; and the initiator (D) is contained in 0.01-10 wt %.

9. The photosensitive resin composition of claim 1, wherein the initiator comprises one or more of a photopolymerization initiator and a radical polymerization initiator.

10. A display device comprising a pattern layer containing a polymerization reaction product of the photosensitive resin composition of claim 1.

11. The display device of claim 10, wherein the display device comprises a plurality of sub-pixels, and wherein the pattern layer is a pixel defining layer configured to divide the plurality of sub-pixels from each other.

12. The display device of claim 10, wherein the pattern layer comprises a taper portion having a taper angle of 20-40 degrees.

* * * * *